(12) United States Patent
Fan

(10) Patent No.: US 7,622,794 B1
(45) Date of Patent: Nov. 24, 2009

(54) COL (CHIP-ON-LEAD) MULTI-CHIP PACKAGE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 30 days.

(21) Appl. No.: 12/133,892

(22) Filed: Jun. 5, 2008

(51) Int. Cl.
*H01L 23/495* (2006.01)

(52) U.S. Cl. .................................................. 257/666

(58) Field of Classification Search ................ 257/666, 257/675, 704–706, E23.031–E23.059; 438/122–125
See application file for complete search history.

(56) References Cited

U.S. PATENT DOCUMENTS 7,564,123 B1 * 7/2009 Wang et al. ................. 257/666

* cited by examiner

*Primary Examiner*—Calvin Lee
(74) *Attorney, Agent, or Firm*—Muncy, Geissler, Olds & Lowe, PLLC

(57) ABSTRACT

A Chip-On-Lead (COL) multi-chip package is revealed, primarily comprising a plurality of leads, a first chip disposed on the first leads, one or more second chips stacked on the first chip, and an encapsulant. The leads have a plurality of internal leads encapsulated inside the encapsulant where the internal leads are fully formed on a downset plane toward and parallel to a bottom surface of the encapsulant. The height between the internal leads to a top surface of the encapsulant is three times or more greater than the height between the internal leads and the bottom surface. Since the number and the thickness of the second chips is under controlled, the thickness between the top surface of the encapsulant and the most adjacent one of the second chips is about the same as the one between the internal leads and the bottom surface of the encapsulant. Therefore, the internal leads of the leads without downset bends in the encapsulant can balance the upper and lower mold flows and carry more chips without shifting nor tilting.

18 Claims, 3 Drawing Sheets

COL (CHIP-ON-LEAD) MULTI-CHIP PACKAGE

FIELD OF THE INVENTION

The present invention relates to packaged semiconductor devices, especially to Chip-On-Lead (COL) multi-chip packages.

BACKGROUND OF THE INVENTION

In the conventional semiconductor packages, leadframes have been widely implemented as chip carriers and as electrical connection media. There are several basic packaging configurations according to the features of the chip carriers such as Chip-On-Lead packages (COL), Lead-On-Chip (LOC) packages, and conventional "chip on die pad" packages where COL packages are to attach the back surfaces of the chips, i.e., the surfaces of the chips without ICs, to certain internal sections of the leads, then the chips and the leads of leadframes are encapsulated by molding. In order to balance the upper and lower mold flows during transfer molding, at least two downset bends are formed on the leads or on the tie bars of the die pad leading to shaking of the leads. Once experienced the pressure of the mold flows during molding processes, the leads having downset bends are sensitive to shift or deform, therefore, space should be reserved in the encapsulant to prevent the internal packaging components such as chips or leads from atmosphere exposure and contaminations. Hence, the number of chips can be stacked inside a package is limited, especially the structural strengths of the leads of COL packages are not strong enough to hold and stack the chips leading to shifting and tilting. Once the chip position changes, the upper and lower mold flows cannot be balanced.

As shown in FIG. 1, a conventional COL multi-chip package 100 comprises a plurality of first leads 110, a plurality of second leads 120, a first chip 130, a second chip 140, and an encapsulant 150. The first leads 110 and the second leads 120 are made of the same leadframe and are inwardly extended from two opposing sides of the encapsulant 150. The first leads 110 have a plurality of first internal leads 111 and a plurality of first external leads 112. The second leads 120 have a plurality of second internal leads 121 and a plurality of second external leads 122. The lengths of the first internal leads 111 are greater than the ones of the second internal leads 122 to support the first chip 130 and the second chip 140 attached thereon. The first external leads 112 and the second external leads 122 extend from the sides of the encapsulant 150 and are bent to a specific shape such as gull leads for external electrical connections. As shown in FIG. 1 again, each internal lead 111 has a first downset bend 114 and a second downset bend 115 formed in the encapsulant 150 to make the chip-attached portions of the first internal leads 111 in a downset position. The first chip 130 has a plurality of first bonding pads 133 on its active surface. The back surface of the chip 130 is disposed on the chip-attached portions of the first internal leads 111. The first bonding pads 133 are electrically connected to the first internal leads 111 and the second internal leads 121 by a plurality of first bonding wires 160. The second chip 140 has a plurality of second bonding pads 143 and is back-to-face stacked on the first chip 130. The second bonding pads 143 are electrically connected to the first internal leads 111 and the second internal leads 121 by a plurality of second bonding wires 170. The encapsulant 150 encapsulates the first internal leads 111, the second internal leads 121, the first chip 130, the second chip 140, the first bonding wires 160, and the second bonding wires 170 with the first external leads 112 and the second external leads 122 exposed. As shown in FIG. 1 again, since the first internal leads 111 experienced two downset bending, i.e., the first downset bend 114 and the second downset bend 115 to change vertical locations of the chips 130 and 140, therefore, the structural strengths of the first internal leads 111 are reduced and the horizontal plane of the first internal leads 111 cannot be firmly controlled. Hence, the first internal leads 111 will shift or tilt due to the pressure of the mold flows during transfer molding leading to the first internal leads 111, the second chip 140, or the bonding wires 170 exposed from the encapsulant 150. Furthermore, the mold flow will further pull the first bonding wires 160 and the second bonding wires 170 leading to broken wires, electrical shorts and lower package yield. Moreover, in order to avoid the second chip 140 to contact the first bonding wires 160 of the first chip 130 stacked below, an interposer 190 such as a dummy chip or PI tape is disposed between the first chip 130 and the second chip 140, however, the stackable heights of the chips are reduced, therefore, more chips can not be stacked. Since the peripheries of the second chip 140 without contacting with the attached portion of the interposer 190 including the peripheries for bonding the second bonding wires 143 can not be supported by the interposer 190 and become overhang during wire bonding. In order to get better wile bonding support for the second bonding wires 170, a certain thickness of the second chip 140 is required which further limits the number of chips can be stacked in the package 100.

SUMMARY OF THE INVENTION

The main purpose of the present invention is to provide a Chip-On-Lead (COL) multi-chip package without any downset bend of internal leads in an encapsulant to balance the upper and lower mold flows and to reduce the shifting of the leads due to mold flows. Therefore, more chips can be stacked on the leads of the Chip-On-Lead (COL) multi-chip package without any shifting nor tilting.

According to the present invention, a Chip-On-Lead (COL) multi-chip package is revealed, primarily comprising a plurality of first leads, a first chip, one or more second chips, and an encapsulant. Each first lead has a first internal lead inside the encapsulant. The first chip is disposed on the first leads, and the second chips are disposed on the first chip. The encapsulant encapsulates the first chip, the second chips, and the first internal leads of the first leads where the encapsulant has a first surface and a second surface parallel to each other. Moreover, the first internal leads are fully formed on a downset plane toward and parallel to the second surface. Moreover, the height between the first internal leads and the first surface is three times or more greater than the height between the first internal leads and the second surface. The encapsulant further has a thickness from the first surface to the second chips about the same as the height from the first internal leads to the second surface of the encapsulant.

DETAIL DESCRIPTION OF THE INVENTION

Please refer to the attached drawings, the present invention will be described by means of embodiments below.

Figure 1:
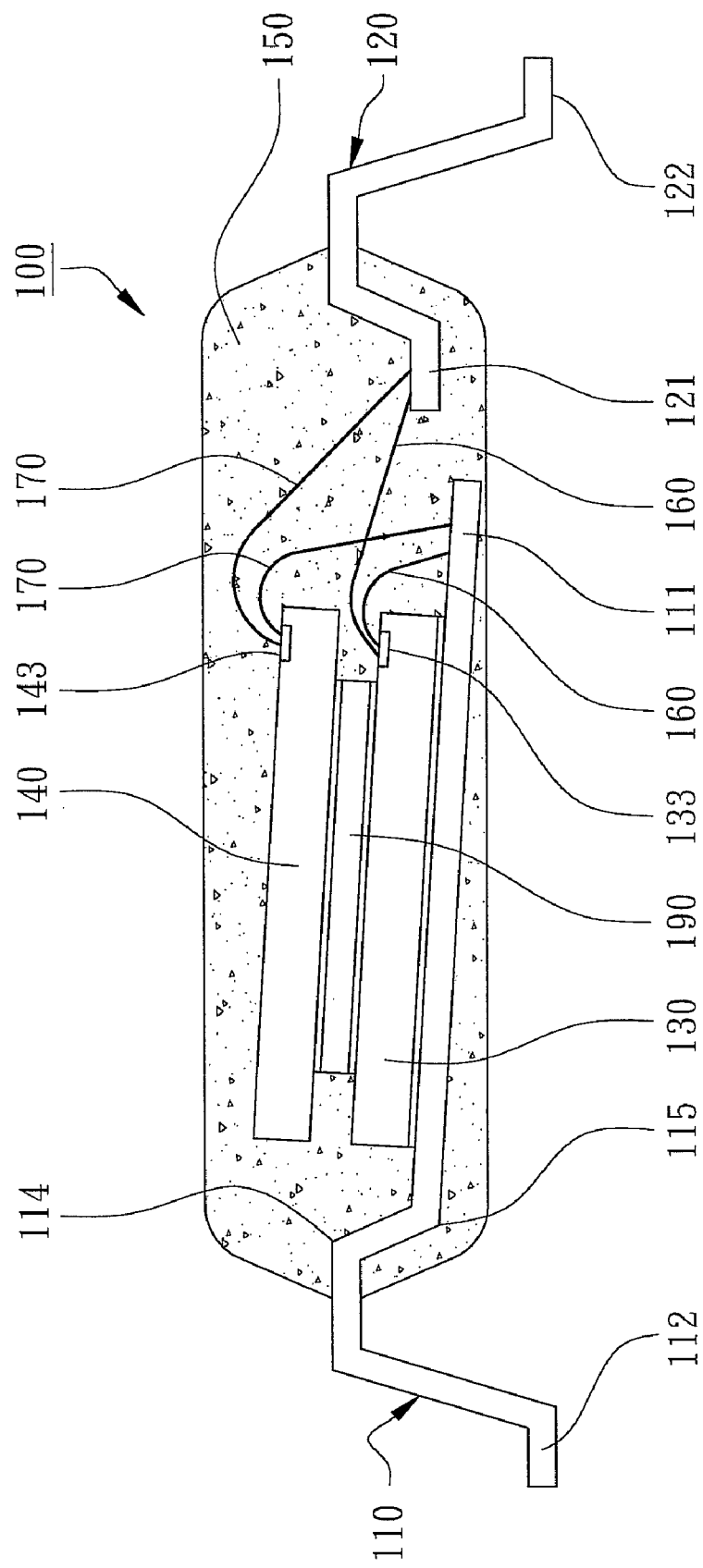
FIG. 1 is a cross-sectional view of a conventional Chip-On-Lead (COL) multi-chip package.
Figure 2:
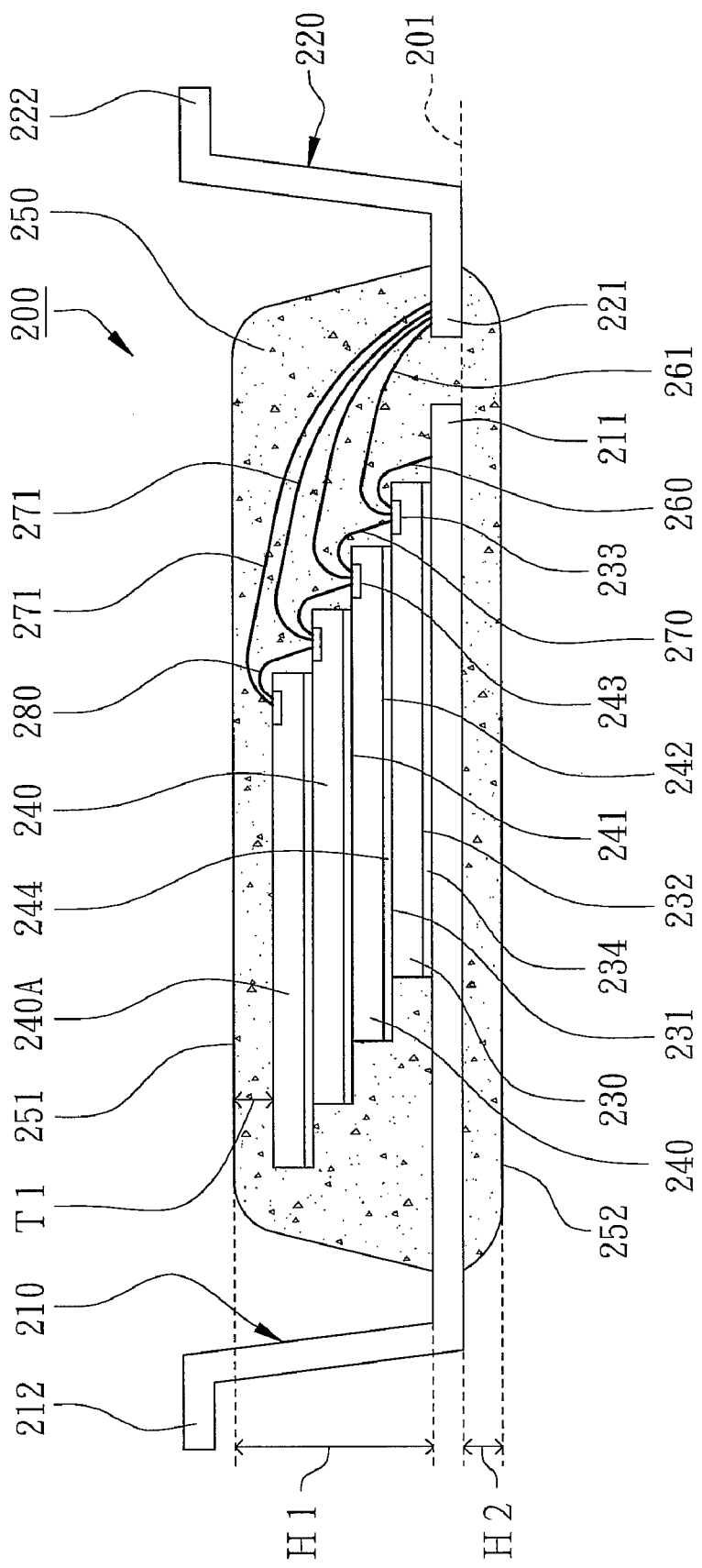
FIG. 2 is a cross-sectional view of a Chip-On-Lead (COL) multi-chip package according to the first embodiment of the present invention.

According to the preferred embodiment of the present invention, a Chip-On-Lead (COL) multi-chip package is revealed in the cross-sectional view of FIG. 2. The COL multi-chip package 200 primarily comprises a plurality of first leads 210, a first chip 230, one or more second chips 240, and an encapsulant 250.

Each first lead 210 has a first internal lead 211 and a first external lead 212 where the internal leads 211 are portions of the first leads 210 disposed inside the encapsulant 250 and the external leads 212 disposed outside the encapsulant 250. The first leads 210 are parts of a metal leadframe made of iron, copper, or other metal alloy where the first leads 210 have an appropriate thickness such as 0.125 mm or more with enough structural strengths to support the first chip 230 and the second chips 240. Preferably, the thickness of the first lead 210 can not be smaller than the one of the first chip 230. Moreover, the first internal leads 211 are coplanarly downset, i.e., the first internal leads 211 are fully formed on a downset plane 201 without weakening the structural strengths to support the chips 230 and 240. The term "fully downset" means that all of the first internal leads 211 are formed on the downset plane 201 so that the first lead 210 have no any downset bend inside the encapsulant 250. The term "downset bend" means that the first internal leads 211 are bent with 90° or other angles to form different bends on different planes from the downset plane 201. To be more specific, the first internal leads 211 are inwardly extended from one side of the encapsulant 250 passing under the back surface of the first chip 230 so that the back surface of the first chip 230 covers certain sections of the first internal leads 211 except a plurality of internal ends of the first internal leads 211. The internal ends of the first internal leads 211 exposed from the first chip 230 are configured as bonding fingers for wire-bonding connections. In the present embodiment, the lengths of the first internal leads 211 are long enough to cross the central line of the COL multi-chip package 200 to support the first chip 230 and the second chips 240. In the present embodiment, the first external leads 212 of the first leads 210 extend from the same side of the encapsulant 250 for mounting to an external printed circuit board, not shown in the figure. The first external leads 212 are bent into gull leads, I-leads, J-leads or other shapes.

As shown in FIG. 2, the first chip 230 is disposed on the first leads 210 where the thickness of the first chip 230 is about 0.125 mm. The first chip 230 has a first active surface 231, a first back surface 232, and a plurality of first bonding pads 233 formed on the first active surface 231. The first back surface 232 is attached to the first internal leads 211 of the first leads 210. The first bonding pads 233 are disposed on one single side of the chip 230. To be more specific, the first back surface 232 of the first chip 230 is attached to the first internal leads 211 to form a Chip-On-Lead (COL) configuration. In the present embodiment, an electrically isolating die-attaching film 234 is fully attached to the first back surface 232 of the first chip 230 and adheres to the first internal leads 211 for die attachment and for increasing the anti-crack strength of the first chip 230 so that the first chip 230 can be even thinner. The thickness of the electrical-isolating die-attaching film 234 is about 0.025 mm.

As shown in FIG. 2, the second chips 240 are stacked on the first chip 230. The bottom one of the second chips 240 is stair-like staggeredly stacked on the first active surface 231 of the first chip 230 with the first bonding pads 233 exposed for the following wire bonding processes. Each second chip 240 has a second active surface 241, a second surface 242, and a plurality of second bonding pads 243 formed on the second active surface 241. Preferably, the second chips 240 are stair-like staggeredly stacked each other without covering the second bonding pads 243 to save conventional interposers between the stacked chips. It reduces the thickness impact of other components except the chips to the upper and lower mold flows and to stack more second chips 240. In the present embodiment, a plurality of electrically isolating die-attaching films 244 are fully attached to the second surfaces 242 of the second chips 240 for die attachment and for increasing the anti-crack strengths of the second chips 240 so that the first chip 240 can be even thinner. The electrically isolating die attaching films 244 adhere to the first active surface 231 of the first chip 230 below or on the second active surface 241 of the other second chips 240. To be more specific, the second chips 240 can be the same chips as the first chip 230 where the first chip 230 and the second chips 240 have the same dimensions with the same arrangement of the bonding pads 243. In the present embodiment, the number of the stacked second chips 240 can be as many as three so that the total number of chips in the Chip-On-Lead (COL) multi-chip package 200 is four where the thickness of each second chip 240 can not greater than the one of the first chip 230. The Chip-On-Lead (COL) multi-chip package 200 is also suitable to stack eight chips. To be more specific, the thickness of each second chip 240 is about the same as the one of the first chip 230, i.e., the thickness of each second chip 240 is about 0.125 mm.

The encapsulant 250 is normally formed by transfer molding to encapsulate the first chip 230, the second chips 240, and the first internal leads 211 from the contaminations of the environment. As shown in FIG. 2 again, the encapsulant 250 further encapsulates a plurality of bonding wires 260, 261, 270, 271 and 280. In the present embodiment, the first external leads 212 of the first leads 210 are outwardly extended from one side of the encapsulant 250 and bent toward the first surface 251 so that the second surface 252 is a laser marking surface to avoid the damage of the bonding wires 271 and 280.

As shown in FIG. 2, since the first internal leads 211 are fully formed on the downset plane 201, the first internal leads 211 are coplanar without any downset bend inside the encapsulant 250. Additionally, the downset plane 201 is formed toward and parallel to the first surface 251 of the encapsulant 250. The distance between the first internal leads 211 to the first surface 251 is defined as the height H1 and the distance between the first internal leads 211 to the second surface 252 is defined as the height H2. Height 111 is greater than height H2. Since the downset plane 201 is set on a lower horizontal location, the height H1 is three times or more greater than the height H2. Moreover, the thickness T1 of the encapsulant 250 is defined as the thickness between the first surface 251 and the most adjacent second chip 240A. Since the number and the thickness of the second chips 240 are predetermined, the thickness T1 is approximately equal to the height H2 to balance the upper and lower mold flows. The thickness T1 is the shortest vertical distance between from the first surface 251 of the encapsulant 250 to the active surface 241 of the most adjacent second chip 240A and the height H2 is the shortest vertical distance between from the lower surfaces of the first internal leads 211 without disposing the first chip 230 to the second surface 252 of the encapsulant 250. To be more specific, the thickness T1 and the height H2 are around 0.138 mm. Preferably, the thicknesses of the first chip 230 and the second chips 240 can be lapped as thin as or smaller than the height H2 to stack more chips because the full attachments of the electrically isolating die-attaching films 234 and 244.

In the present embodiment, the thickness of the Chip-On-Lead (COL) multi-chip package 200 is set at 1.000 mm. To be more specific, the height H1 is the distance from the upper surfaces of the first internal leads 211 on which the first chip 230 are disposed to the first surface 251 where the height H1 is equal to the total amount including the thicknesses of the first chip 230 (about 0.125 mm), the three second chips 240 (about 0.125 mm per each), the four electrically isolating die-attaching films 234 and 244 (about 0.025 mm per each), and the thickness T1 (about 0.138 mm). Therefore, the height H1 can be calculated to be about 0.738 mm and the H2 is about 0.138 mm. In the present embodiment, it is very obvious that the height H1 is about five times greater than the height H2 to stack four chips. In different embodiments, the ratio of the height H1 to the height H2 can be 3 to 1 or 4 to 1 to stack two or three chips.

Therefore, the first internal leads 211 of the first leads 210 can balance the upper and lower mold flows and reduce the shifting and tilting of the chip and avoid the leads exposed or/and the bonding wires broken due to mold flows without forming any downset bends of the first internal leads 211 inside the encapsulant 250 so that more chips can be stacked on the first internal leads 211 of the first leads 210 without shifting nor tilting. Since the first internal leads 211 inside the encapsulant 250 are fully formed on the downset plane 201 without affecting by the mold flows, the first internal leads 211 of the first leads 210 can be kept in parallel to the adjacent second surface 252 of the encapsulant 250 during the molding processes. More space above the first chip 230 is provided for stacking more second chips 240. Therefore, the memory capacity can be increased by stacking more chips without increasing the total package thickness nor changing product reliability. Preferably, since the second chips 240 are stair-like staggeredly stacked to save conventional interposer, the chip attached height between the second chips 240 (equal to the thickness of the electrically isolating die-attaching film 244) can be about the same as the chip attached height between the first chip 230 and the first internal leads 211 (equal to the thickness of the electrically isolating die-attaching film 234). This is very easy to calculate to the thickness T1 and the stacking number of the chips to achieve the upper and lower mold flows. Furthermore, the production cycle time of the Chip-On-Lead (COL) multi-chip package 200 can be shortened by eliminating the step of formation extra downset bends.

As shown in FIG. 2, in the present embodiment, the Chip-On-Lead (COL) multi-chip package 200 further comprises a plurality of second leads 220 where each second lead 220 has a second internal lead 221 and a second external lead 222 where the second internal lead 221 is the encapsulated section of the second lead 220 inside the encapsulant 250, the second external lead 222 extends from one side of the encapsulant 250. The second leads 220 and the first leads 210 are from the same leadframe where the second leads 220 and the first leads 210 are located at two opposing sides of the Chip-On-Lead (COL) multi-chip package 200. To be more specific, the thickness of the second leads 220 is approximately equal to the one of the first leads 210 (about 0.125 mm or greater) so that the thicknesses of the second leads 220 is also not smaller than the one of the first chip 230. The number of the second leads 220 can be the same as the one of the first leads 210. In the present embodiment, the Chip-On-Lead (COL) multi-chip package 200 is a Thin Small Outline Package, TSOP, with forty eight leads, therefore, the numbers of the first leads 210 and the second leads 220 are twenty foul. Additionally, the second internal leads 221 of the second leads 220 are shorter than the first internal leads 211 of the first leads 210 without carrying the first chip 230. The second internal leads 221 inwardly extend from a same side of the encapsulant 250 and toward the first internal leads 211 under the first chip 230 but not carry the first chip 230. As shown in FIG. 2 again, preferably, the second internal leads 221 are coplanar with the first internal leads 211 so that the second internal leads 221 are also fully formed on the downset plane 201. In the present embodiment, the second external leads 222 of the second leads 220 are also bent toward the first surface 251 of the encapsulant 250. The first external leads 212 and the second external leads 222 both are configured for mounting to a PCB.

As shown in FIG. 2, to be more specific, the Chip-On-Lead (COL) multi-chip package 200 further comprises a plurality of first bonding wires 260 electrically connecting the first bonding pads 233 to the first internal leads 211 of the first leads 210. Some of the first bonding wires 261 electrically connect the first bonding pads 233 to the second internal leads 221 of the second leads 220. To be more specific, the Chip-On-Lead (COL) multi-chip package 200 further comprises a plurality of interconnecting bonding wires 280 electrically connecting the second bonding pads 243 of two adjacent second chips 240. Preferably, a plurality of second bonding wires 270 electrically connect the second bonding pads 243 on the bottom one of the second chips 240 to the first bonding pads 233 so as to achieve the electrical interconnections from the second chips 240 to the first and second leads 210, 220 through the first chip 230. Accordingly, only few or none of long bonding wires 271 are needed to electrically connect the second bonding pads 243 to the second internal leads 221. Therefore, the decrease or exempt of long bonding wires 271 can avoid cross-wiring to reduce the risk of wire sweep and wire exposure from the encapsulant 250.

Figure 3:
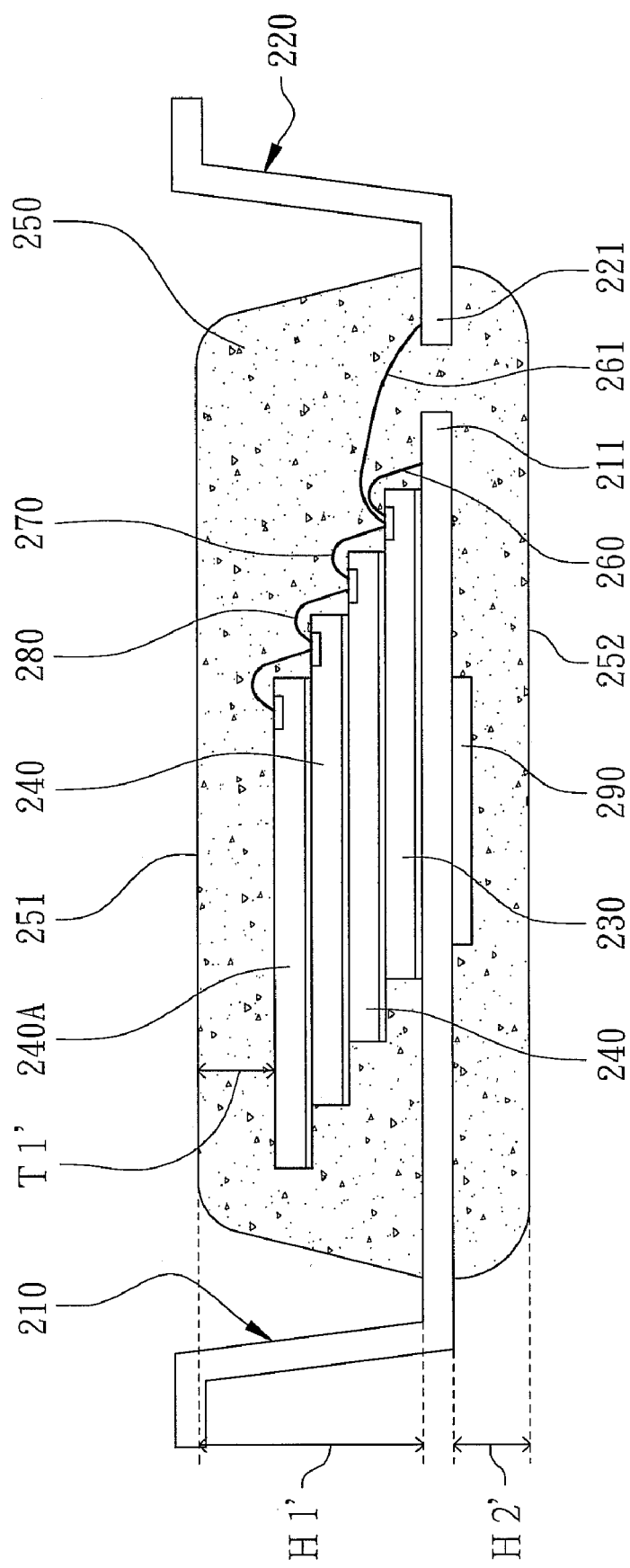
FIG. 3 shows a cross-sectional view of another Chip-On-Lead (COL) multi-chip package according to the second embodiment of the present invention.

In the second embodiment of the present invention, as shown in FIG. 3, another Chip-On-Lead (COL) multi-chip package is revealed where its major components are about the same as the ones of the first embodiment, therefore, the component numbers are the same as the first embodiment. The COL multi-chip package primarily comprises the plurality of first leads 210, the first chip 230, one or more the second chips 240, and the encapsulant 250. In the present embodiment, the height H1' is defined as the distance between the first internal leads 211 of the first leads 210 and the first surface 251 of the encapsulant 250 and the height H2' is defined as the distance between the first internal leads 211 to the second surface 252 of the encapsulant 250 where the height H1' is three times more than the height H2'. The thickness T1' of the encapsulant 250 is defined as the thickness between the first surface 251 and the most adjacent second chip 240A. By controlling the number and the thickness of the second chips 240, the thickness T1' is approximately equal to the height H2' to balance the upper and lower mold flows. As shown in FIG. 3, the Chip-Oil-Lead (COL) multi-chip package further comprises a space-keeping tape 290 disposed on the surfaces of the first internal leads 211 of the first leads 210 facing to the second surface 252 of the encapsulant 250. Therefore, the spacing between the first internal leads 211 of the first leads 210 can be kept to avoid shifting of the first internal leads 210 due to the mold flows during molding processes. The thickness of the space-keeping tape 290 is about 0.070 mm where the space-keeping tape 290 can be a PI (polyimide) tape. The first bonding wires 260 and 261 electrically connecting the bonding pads of the first chip 230 to the first internal leads 211 and the second internal leads 221. The second bonding wires 270 electrically connect the bonding pads of the bottom one of the second chips 240 to the bonding pads of the first chip 230. The interconnecting bonding wires 280 electrically connect the bonding pads of two adjacent second chips 240. The second chips 240 can be electrically communicated to the first leads 210 and the second leads 220 with no need of long bonding wires directly connecting the second chip 240 to the leads 210, 220.

The above description of embodiments of this invention is intended to be illustrative but not limiting. Other embodiments of this invention will be obvious to those skilled in the art in view of the above disclosure.

What is claimed is:

1. A Chip-On-Lead (COL) multi-chip package primarily comprising:
   a plurality of first leads each having a first internal lead;
   a first chip disposed on the first leads;
   one or more second chips stacked on the first chip; and
   an encapsulant encapsulating the first chip, the second chips, and the first internal leads of the first leads, the encapsulant having a first surface and a second surface parallel to each other;
   wherein the first internal leads are fully formed on a downset plane toward and parallel to the second surface and the height between the first internal leads and the first surface are three times or more greater than the height between the first internal leads and the second surface; wherein the encapsulant further has a thickness from the first surface to the second chips about the same as the height from the first internal leads to the second surface of the encapsulant; wherein each second chip has second bonding pads; and wherein the second chips are stair-like staggeredly stacked on each other without covering the second bonding pads.

2. The COL multi-chip package as claimed in claim 1, wherein the number of the second chips is three.

3. The COL multi-chip package as claimed in claim 1, wherein the first chip has a first active surface, a first back surface, and a plurality of first bonding pads formed on the first active surface, wherein the first back surface is attached to the first internal leads.

4. The COL multi-chip package as claimed in claim 3, further comprising a plurality of first bonding wires electrically connecting the first bonding pads to a plurality of internal ends of the first internal leads extending from the first chip.

5. The COL multi-chip package as claimed in claim 1, wherein the thickness of each second chip is not greater than the one of the first chip, and the thickness of the first leads is not smaller than the one of the first chip.

6. The COL multi-chip package as claimed in claim 1, wherein each first lead further has a first external lead extending from one side of the encapsulant.

7. The COL multi-chip package as claimed in claim 6, wherein the first external leads of the first leads are bent toward the first surface of the encapsulant.

8. The COL multi-chip package as claimed in claim 7, further comprising a plurality of second leads each having a second internal lead, wherein the second internal leads are shorter than the first internal leads without carrying the first chip.

9. The COL multi-chip package as claimed in claim 8, wherein the second internal leads of the second leads are coplanar with the first internal leads.

10. The COL multi-chip package as claimed in claim 9, wherein the number of the second leads is the same as the one of the first leads.

11. The COL multi-chip package as claimed in claim 9, wherein each second lead further has a second external lead extending from one side of the encapsulant.

12. The COL multi-chip package as claimed in claim 11, wherein the second external leads of the second leads are bent toward the first surface of the encapsulant.

13. The COL multi-chip package as claimed in claim 1, further comprising a plurality of second bonding wires electrically connecting the second bonding pads to the first bonding pads.

14. The COL multi-chip package as claimed in claim 13, further comprising a plurality of interconnecting bonding wires electrically connecting the second bonding pads of two adjacent second chips.

15. The COL multi-chip package as claimed in claim 14, further comprising a plurality of first bonding wires electrically connecting the first bonding pads to the first internal leads and the second internal leads.

16. The COL multi-chip package as claimed in claim 1, further comprising a space-keeping tape attached to a plurality of surfaces of the first internal leads of the first leads facing to the second surface of the encapsulant.

17. The COL multi-chip package as claimed in claim 1, wherein the first chip and the second chips are thinned by lapping each to have a chip thickness not greater than the height between the first internal leads and the second surface.

18. The COL multi-chip package as claimed in claim 17, further comprising a plurality of electrically isolating die-attaching films fully attached to a plurality of back Surfaces of the first chip and the second chips.

* * * * *